(12) United States Patent  (10) Patent No.: US 8,440,536 B2
Jung  (45) Date of Patent: May 14, 2013

(54) MASK LAYOUT AND METHOD FOR FORMING VERTICAL CHANNEL TRANSISTOR IN SEMICONDUCTOR DEVICE USING THE SAME

(75) Inventor: Jin-Ki Jung, Ichon-shi (KR)

(73) Assignee: Hynix Semiconductor Inc., Ichon-shi, Kyoungki-do (KR)

( * ) Notice: Subject to any disclaimer, the term of this patent is extended or adjusted under 35 U.S.C. 154(b) by 18 days.

(21) Appl. No.: 13/173,389

(22) Filed: Jun. 30, 2011

(65) Prior Publication Data

US 2011/0256354 A1 Oct. 20, 2011

Related U.S. Application Data

(62) Division of application No. 12/164,675, filed on Jun. 30, 2008, now Pat. No. 7,994,061.

(30) Foreign Application Priority Data

Dec. 24, 2007 (KR) ........................ 10-2007-0136514

(51) Int. Cl.
H01L 29/76 (2006.01)
H01L 29/94 (2006.01)
H01L 31/062 (2006.01)
H01L 31/119 (2006.01)

(52) U.S. Cl.
USPC ................. 438/396; 257/288; 257/E21.058; 257/E21.135; 257/E21.229; 257/E21.231; 257/E21.546; 257/E21.551; 257/E21.629; 257/E21.645

(58) Field of Classification Search .................. 257/396, 257/192, 288, 296, 328, 335, E21.058, E21.135, 257/E21.229, E21.231, E21.546, E21.551, 257/E21.629, E21.645

See application file for complete search history.

(56) References Cited

U.S. PATENT DOCUMENTS 7,368,352 B2 * 5/2008 Kim et al. ..................... 438/268
7,670,909 B2   3/2010 Cho
7,994,061 B2 * 8/2011 Jung ............................ 438/700

(Continued)

FOREIGN PATENT DOCUMENTS

KR 1020060041415 5/2006
KR 1020070009140 1/2007
KR 1020070047069 5/2007

OTHER PUBLICATIONS

Korean Notice of Allowance for 10-2007-0136514.

(Continued)

*Primary Examiner* — David Nhu
(74) *Attorney, Agent, or Firm* — Lowe Hauptman Ham & Berner LLP

(57) ABSTRACT

A method for forming a vertical channel transistor in a semiconductor memory device includes: forming a plurality of pillars over a substrate so that the plurality of pillars are arranged in a first direction and a second direction crossing the first direction, and so that each of the pillars has a hard mask pattern thereon; forming an insulation layer to fill a regions between the pillars; forming a mask pattern over a resultant structure including the insulation layer, wherein the mask pattern has openings exposing gaps between each two adjacent pillars in the first direction; etching the insulation layer to a predetermined depth using the mask pattern as an etching barrier to form trenches; and filling the trenches with a conductive material to form word lines extending in the first direction.

5 Claims, 11 Drawing Sheets

U.S. PATENT DOCUMENTS

2007/0284623 A1 12/2007 Kim et al.
2009/0004797 A1 1/2009 Lee
2009/0114981 A1 5/2009 Sung et al.
2009/0163017 A1 6/2009 Cho

OTHER PUBLICATIONS

Korean Office Action for 10-2007-0136514.

* cited by examiner

A-A' SECTION

A-A' SECTION

A-A' SECTION

B-B' SECTION

A-A' SECTION

A-A' SECTION

MASK LAYOUT AND METHOD FOR FORMING VERTICAL CHANNEL TRANSISTOR IN SEMICONDUCTOR DEVICE USING THE SAME

CROSS-REFERENCE TO RELATED APPLICATIONS

The present invention is Divisional Application of U.S. patent application Ser. No. 12/164,675, filed Jun. 30, 2008, now U.S. Pat. No. 7,994,061, which claims priority of Korean patent application number 2007-0136514, filed on Dec. 24, 2007, which is incorporated by reference in its entirety.

BACKGROUND OF THE INVENTION

The present invention relates to a method for fabricating a semiconductor device, and more particularly, to a mask layout for a word line and a method for forming a vertical channel transistor in a semiconductor device using the mask layout.

Recently, an occupation area for a transistor is gradually reduced as a semiconductor device becomes highly integrated. This leads to a decrease in a channel length of the transistor. However, it is difficult for a typical planar transistor to overcome a short channel effect caused by the decrease in the channel length of the transistor and to provide a required device size.

SUMMARY OF THE INVENTION

To solve such difficulties of the planar transistor, a vertical channel transistor has been proposed, which can increase the integration degree of a semiconductor device and prevent the short channel effect of a transistor as well.

FIGS. 1A to 1F illustrate a method for forming a vertical channel transistor in a semiconductor device. Herein, cross-sectional views are taken along line A-A' of plan views in FIGS. 1A to 1F.

Referring to FIG. 1A, a plurality of hard mask patterns 12, which are arranged in a first direction and a second direction crossing the first direction, are formed over a semiconductor substrate 10. The hard mask pattern 12 serves as an etch barrier while the semiconductor substrate 10 is etched to form a pillar. The hard mask pattern 12 may be formed of a nitride. A pad oxide layer (not shown) may be disposed under the hard mask pattern 12. The semiconductor substrate 10 is etched to a predetermined depth using the hard mask pattern 12 as an etch barrier, thereby forming an upper pillar 11A.

Referring to FIG. 1B, a spacer 13 is formed on sidewalls of the upper pillar 11A and the hard mask pattern 12, and the exposed semiconductor substrate 10 is further etched to a predetermined depth using the hard mask pattern 12 and the spacer 13 as etch barriers so that a preliminary lower pillar 11B is formed under the upper pillar 11A. Resultingly, a plurality of preliminary pillars 110, each of which includes the preliminary lower pillar 11B and the upper pillar 11A. The preliminary pillars 110 are arranged in the first and second directions. Although the hard mask pattern 12 has a rectangular shape in plan view, the preliminary pillar 110 has a substantially cylindrical shape while undergoing etching processes or the like.

Referring to FIG. 1C, the exposed semiconductor substrate 10 is isotropically etched using the hard mask pattern 12 and the spacer 13 as etch barriers so that sidewalls of the preliminary lower pillar 11B are recessed to a predetermined width. As a result, a pillar 110A for an active region is formed, which includes the upper pillar 11A and a lower pillar 11C under the upper pillar 11A. A gate dielectric layer 14 is formed over the semiconductor substrate 10 including the lower pillar 11C. A conductive layer for a gate electrode is formed over a resultant structure, and an etchback is performed on the conductive layer until the gate dielectric layer 14 is exposed, thereby forming a surround type gate electrode 15 surrounding the lower pillar 11C.

Referring to FIG. 1D, impurities are doped into the semiconductor substrate 10 between the pillars 110A to form impurity regions for bit lines. A first trench T1 for device isolation is formed to a depth enough to penetrate the impurity region, thus defining bit lines 16. A width W1 of the first trench T1 is smaller than a width Wa between columns of the pillars 110A arranged in the second direction.

Referring to FIG. 1E, an oxide layer 17, which has a thickness enough to fill a region between the pillars 110A, is formed over the resultant structure including the first trench T1. The oxide layer 17 is planarized until the hard mask pattern 12 is exposed.

A mask pattern 18 for forming a word line is formed over the planarized resultant structure. Specifically, the mask pattern 18 is a line type mask pattern covering a region between rows of the pillars 110 arranged in the first direction. To ensure an overlap margin, it is preferable that a width Wb of the line type mask pattern 18 is greater than a distance We between the rows of the pillars 110 arranged in the first direction. The oxide layer 17 is etched to a predetermined depth using the line type mask pattern 18 as an etch barrier to form a second trench T2 for a word line, which exposes an upper portion of the gate electrode 15.

Referring to FIG. 1F, a conductive layer is formed to partially fill the second trench T2, thereby forming a word line 19 that interconnects the surround type gate electrodes 15 and extends in the first direction. However, during the process of etching the oxide layer 17 using the line type mask pattern 18 to form the second trench T2, the hard mask pattern 12 formed of nitride is excessively lost. This is because the hard mask pattern 12 is exposed due to characteristics of the line type mask pattern 18 even after the mask process has been performed.

FIGS. 2A and 2B illustrate micrographic views of a vertical channel transistor according to the method.

Referring to FIG. 2A, it can be observed that a height of the hard mask pattern is decreased and an upper portion of the hard mask pattern is formed to have a spire shape. The loss of the hard mask pattern 12 becomes more serious during subsequent processes, causing the upper pillar 11A to be exposed and the exposed upper pillar 11A to be attacked.

Moreover, according to the method for forming the vertical channel transistor in the semiconductor device, after the oxide layer 17 is etched using the line type mask pattern 18 to form the second trench T2, the oxide layer 17 not etched under the line type mask pattern 18 may lean in a certain direction. This is so called a leaning phenomenon.

FIG. 2B is a micrographic view corresponding to a cross-sectional view taken along line B-B' of a plane view in FIG. 1E. Referring to FIG. 2B, it can be observed that the oxide layer, which is not etched under the line type mask pattern, leans in a certain direction. This is because a spin on dielectric (SOD) layer, which is widely used as the oxide layer 17 to enhance gap-fill property, is thermally unstable, and the oxide layer 17 under the line type mask pattern 18 is also formed to have a line shape. Accordingly, the leaning phenomenon unfavorably occurs so that the line type oxide layer 17 formed of SOD or the like leans during a subsequent thermal process.

Since the loss of the hard mask pattern or the leaning phenomenon will become more and more serious as the pillar is reduced in size.

At least one preferred embodiment of the present invention is therefore directed to providing a mask layout and a method for forming a vertical channel transistor in a semiconductor device using the same, which can minimize a loss of a hard mask on a pillar and a leaning phenomenon of an insulation layer remaining under a mask pattern after a trench for a word line is formed, by using the mask pattern having a box- or bar-shaped opening instead of a line type mask pattern.

In accordance with an aspect of the present invention, there is provided a method for forming a vertical channel transistor in a semiconductor memory device. The method comprises forming a plurality of pillars over a substrate, the plurality of pillars being arranged in a first direction and a second direction crossing the first direction, and each of the pillars having a hard mask pattern thereon, forming an insulation layer to fill regions between the pillars, forming a mask pattern on a resultant structure including the insulation layer, wherein the mask pattern has openings exposing gaps between each two adjacent pillars in the first direction, etching the insulation layer to a predetermined depth using the mask pattern as an etch barrier to form a trench, and partially filling the trench with a conductive material to form a word line extending in the first direction.

In accordance with another aspect of the present invention, there is provided a mask layout for forming a word line of a vertical channel transistor including a plurality of pillars arranged in a first direction and a second direction crossing the first direction, the mask layout comprising openings exposing only regions between each two adjacent pillars in rows of the pillars arranged in the first direction.

DESCRIPTION OF SPECIFIC EMBODIMENTS

FIGS. 3A to 3F illustrate a method for forming a vertical channel transistor in a semiconductor device in accordance with an embodiment of the present invention. Herein, cross-sectional views are taken along line A-A' of plan views in FIGS. 3A to 3F.

Figure 3A:
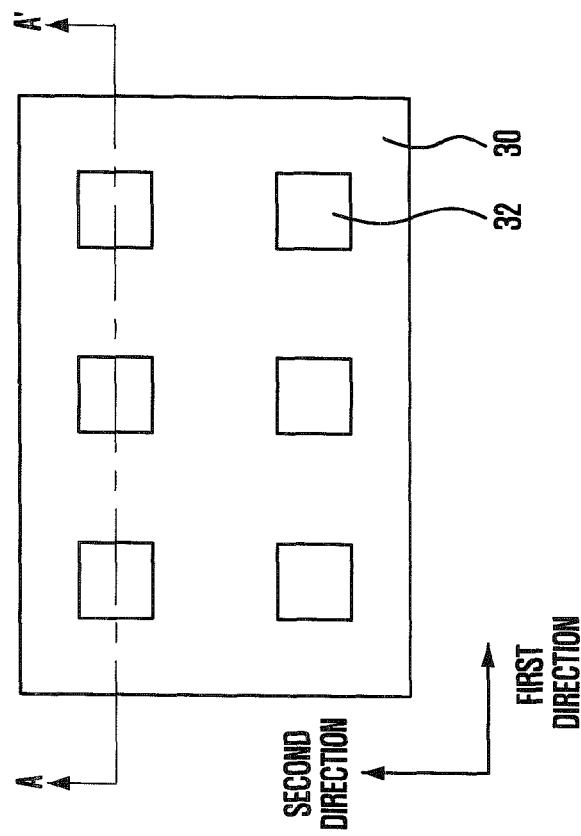
FIGS. 3A to 3F illustrate a method for forming a vertical channel transistor in a semiconductor device in accordance with an embodiment of the present invention.
Figure 3A:
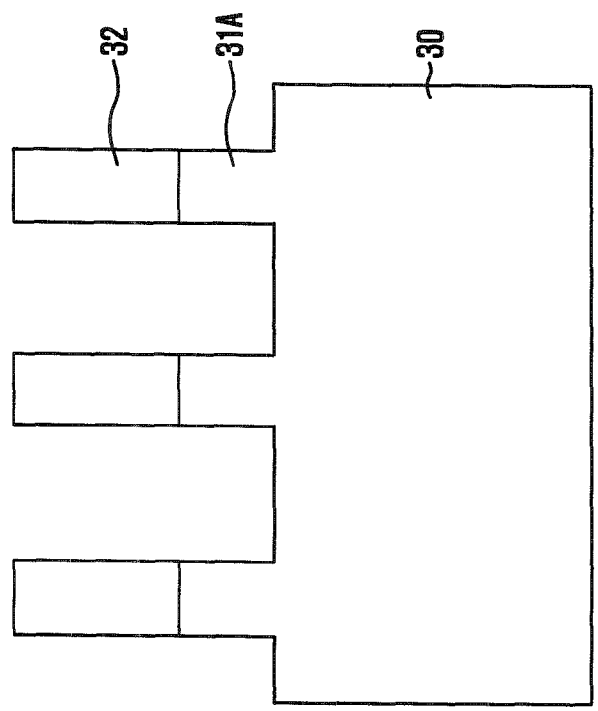

Referring to FIG. 3A, a plurality of hard mask patterns 32, which are arranged in a first direction and a second direction crossing the first direction, are formed over a semiconductor substrate 30. The hard mask pattern 32 may be formed of nitride, and a pad oxide layer (not shown) may be disposed under the hard mask pattern 32. The semiconductor substrate 30 is etched to a predetermined depth using the hard mask pattern 32 as an etch barrier, thereby forming an upper pillar 31A.

Figure 3B:
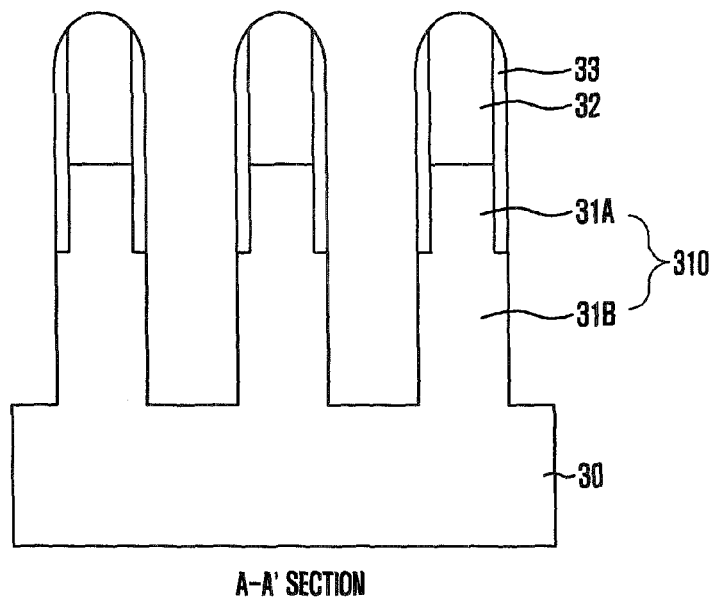

Referring to FIG. 3B, a spacer 33 is formed on sidewalls of the upper pillar 31A and the hard mask pattern 32, and the exposed semiconductor substrate 30 is further etched to a predetermined depth using the hard mask pattern 32 and the spacer 33 as etch barriers so that a preliminary lower pillar 31B is formed under the upper pillar 31A. It is preferable that the spacer 33 is formed of nitride.

Resultingly, a plurality of preliminary pillars 310 are formed, each of which includes the preliminary lower pillar 31B and the upper pillar 31A. The preliminary pillars 310 are arranged in the first and second directions. Although the hard mask pattern 32 has a rectangular shape in plan view, the preliminary pillar 310 has a substantially cylindrical shape while undergoing etching processes or the like.

Figure 3C:
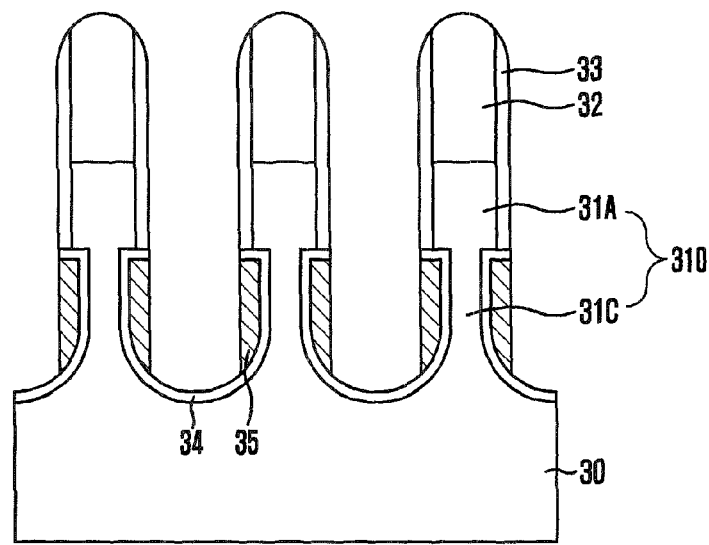

Referring to FIG. 3C, the semiconductor substrate 30 is isotropically etched using the hard mask pattern 32 and the spacer 33 as etch barriers so that sidewalls of the preliminary lower pillar 31B are recessed to a predetermined width. As a result, a pillar 310A for an active region is formed, which includes the upper pillar 31A and a lower pillar 31C under the upper pillar 31A. A gate dielectric layer 34 is formed over the semiconductor substrate 30 including the lower pillar 31C. A conductive layer for a gate electrode is formed over a resultant structure, and an etchback is performed on the conductive layer until the gate dielectric layer 34 is exposed, thereby forming a surround type gate electrode 35 surrounding the lower pillar 31C.

Figure 3D:
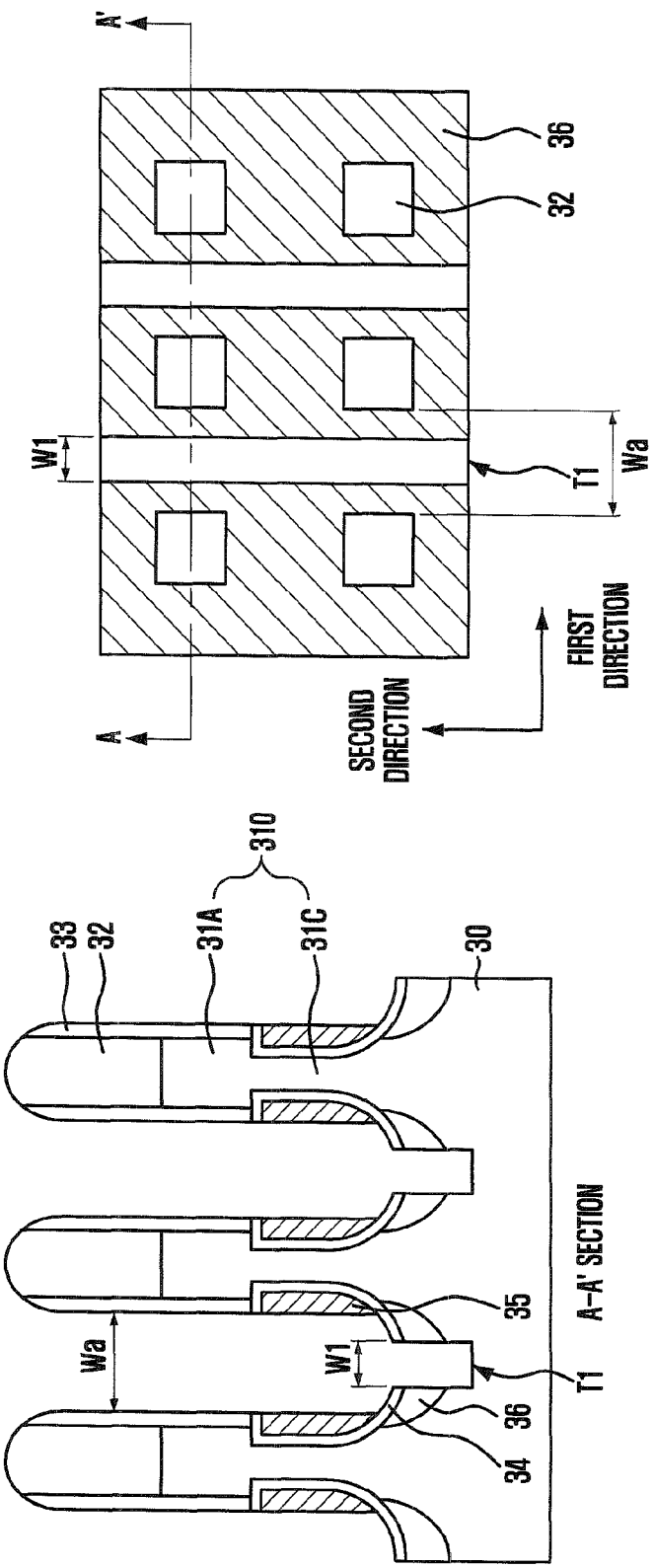

Referring to FIG. 3D, impurities are doped into the semiconductor substrate 30 between the pillars 310A to form impurity regions for bit lines. A first trench T1 for device isolation is formed to a depth enough to penetrate the impurity region, thus defining bit lines 36. A width W1 of the first trench T1 is smaller than a width Wa between columns of the pillars 310A arranged in the second direction.

Figure 3E:
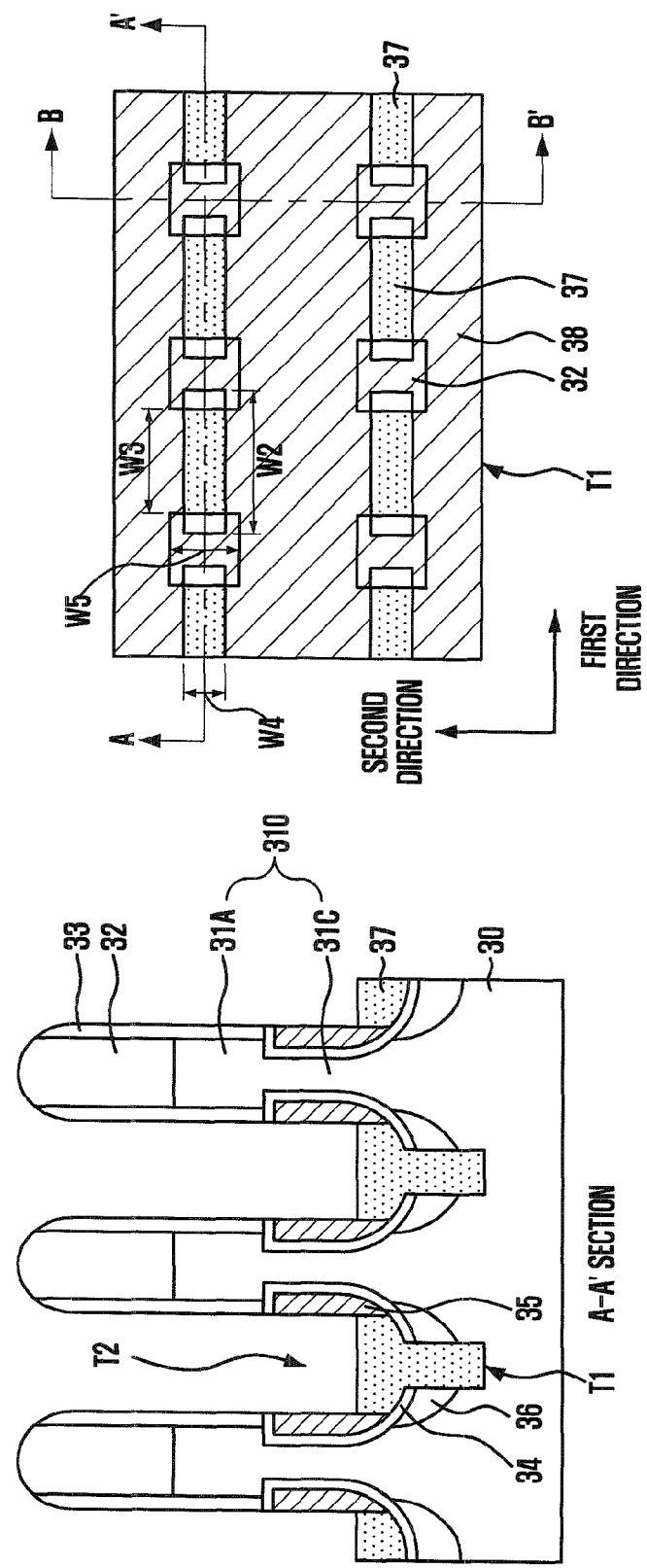

Referring to FIG. 3E, an oxide layer 37, which has a thickness enough to fill a region between the pillars 310A, is formed over the resultant structure including the first trench T1. The oxide layer 37 is planarized until the hard mask pattern 32 is exposed.

Figure 1A:
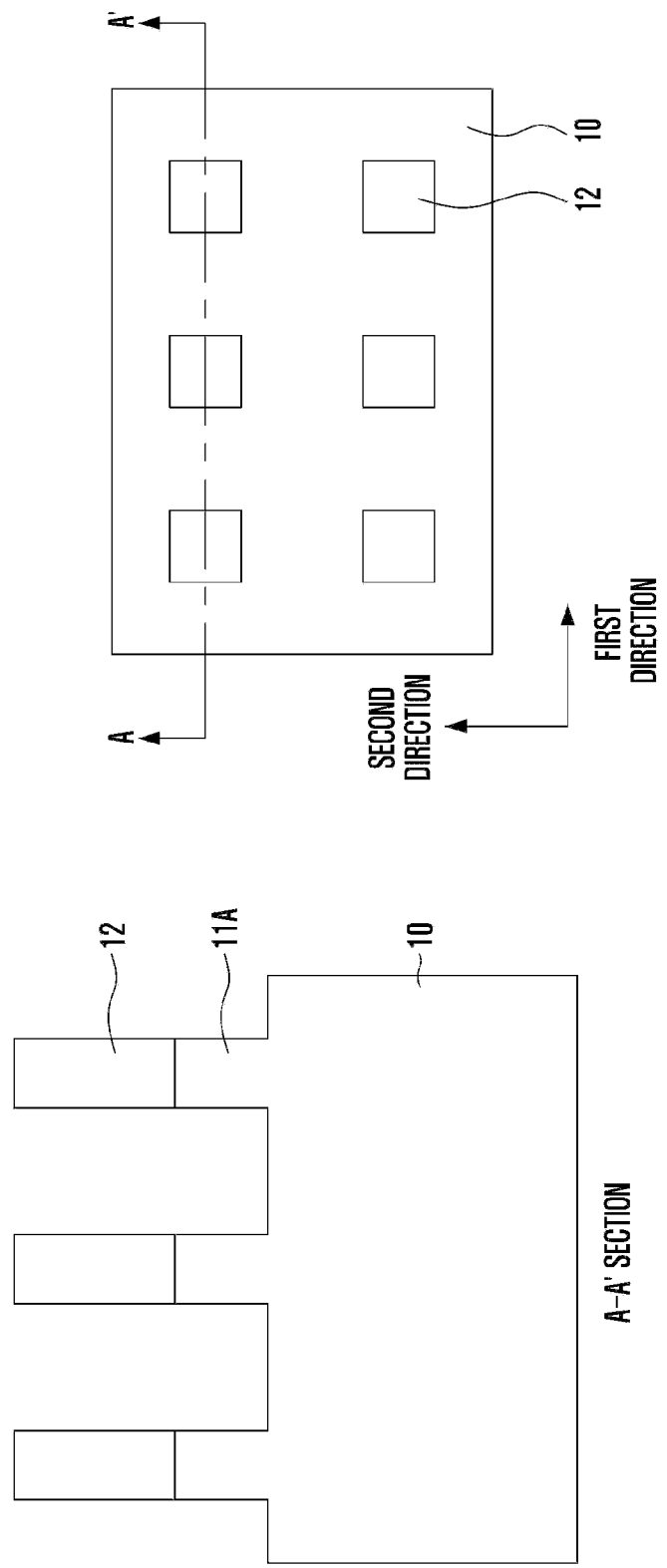
FIGS. 1A to 1F illustrate a method for forming a vertical channel transistor in a semiconductor device.
Figure 1B:
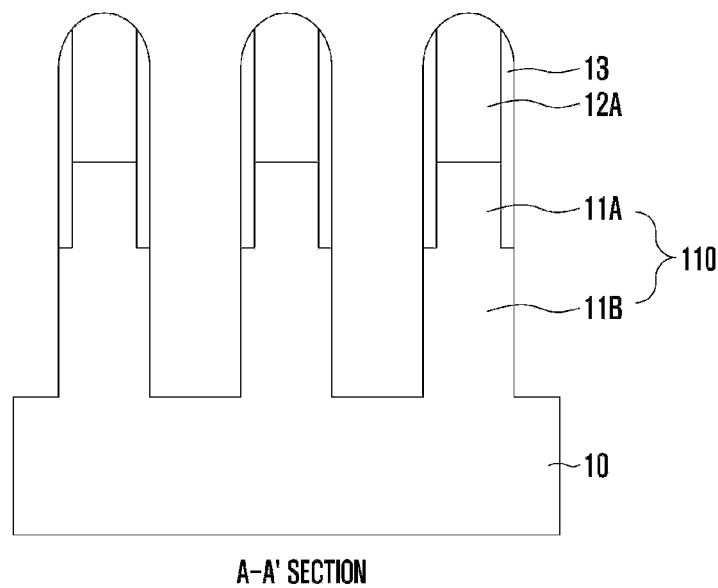
Figure 1C:
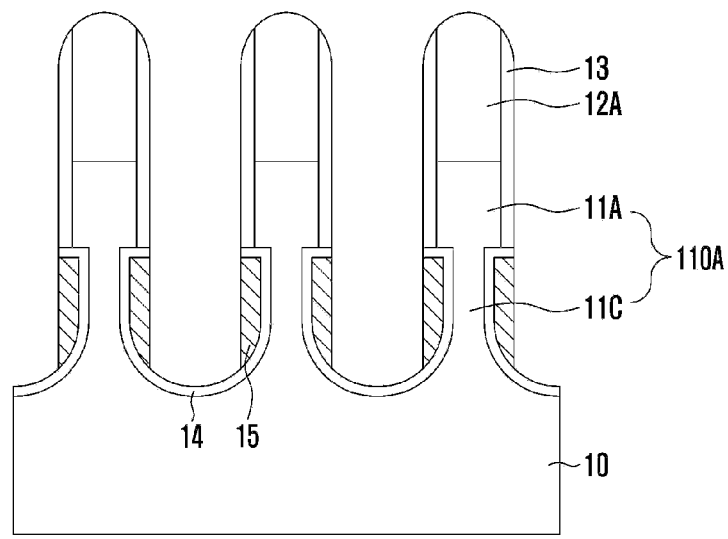
Figure 1D:
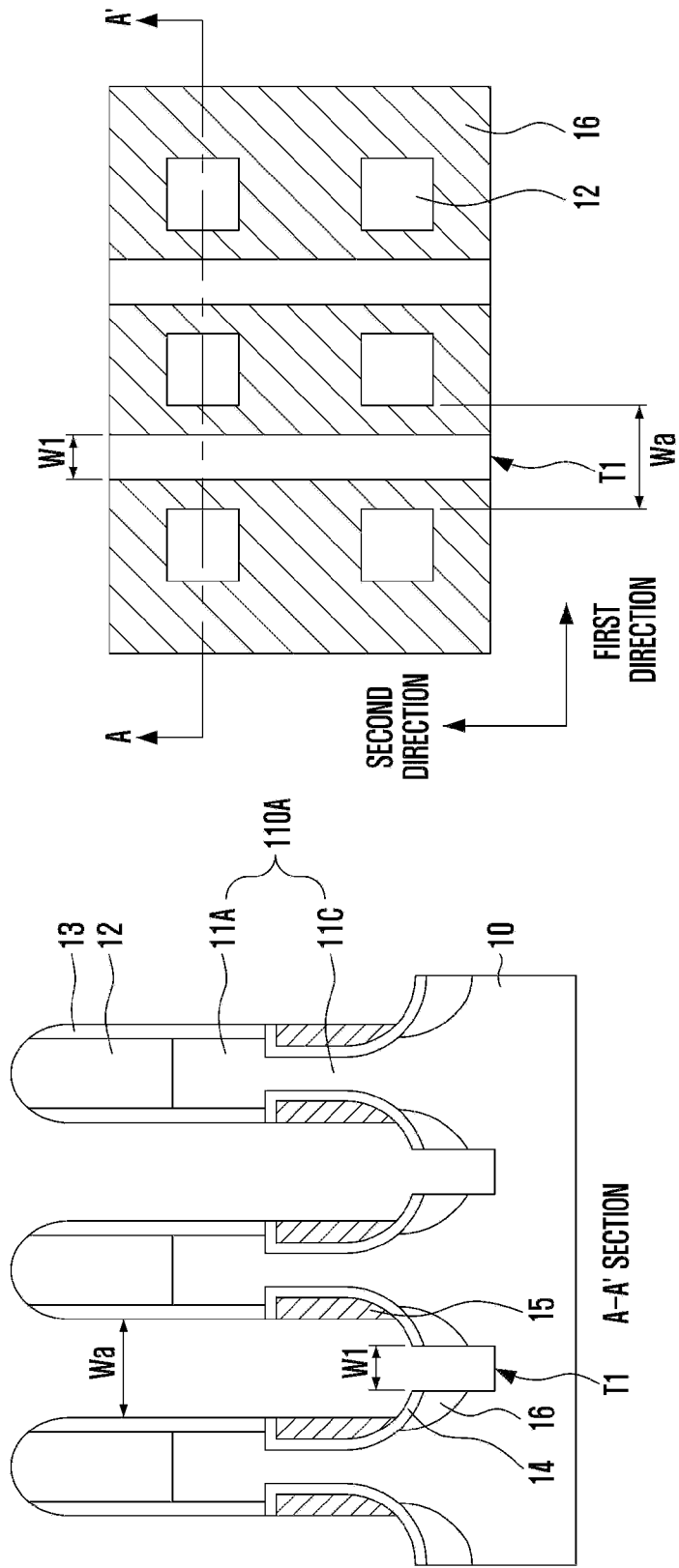
Figure 1E:
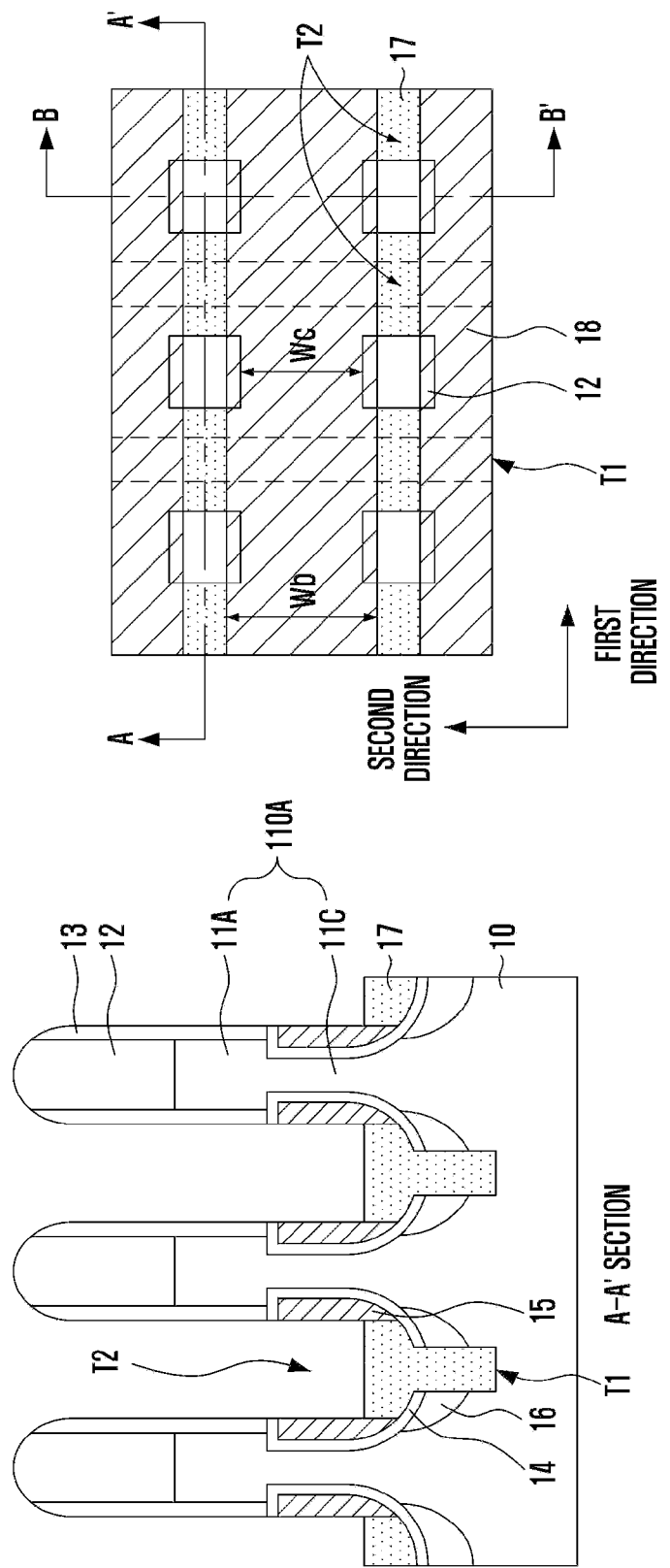
Figure 1F:
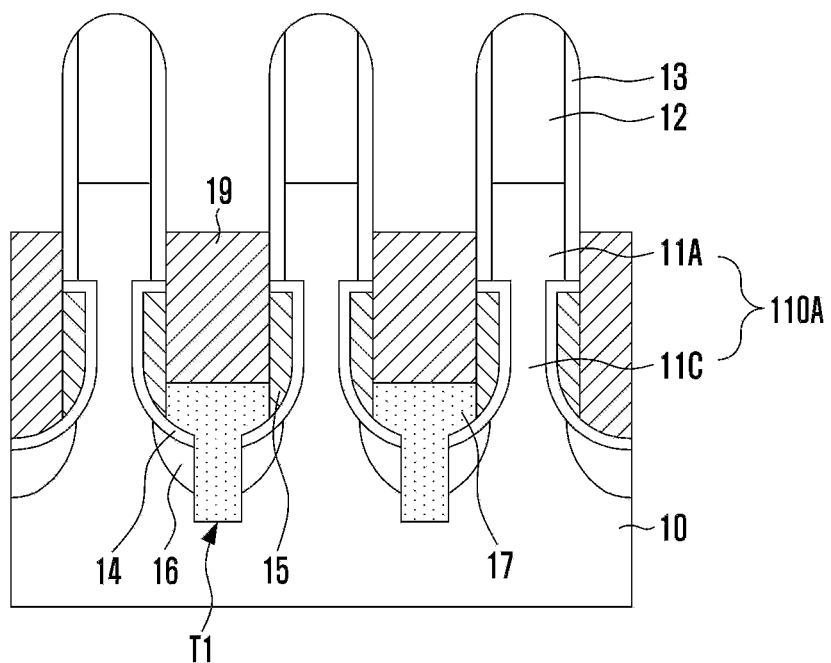
Figure 2A:
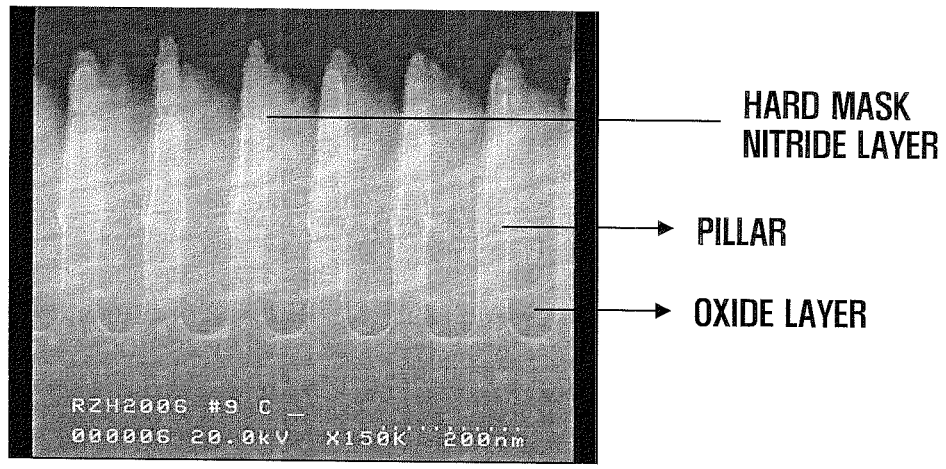
FIGS. 2A and 2B illustrate micrographic views of a vertical channel transistor according to the method.
Figure 2B:
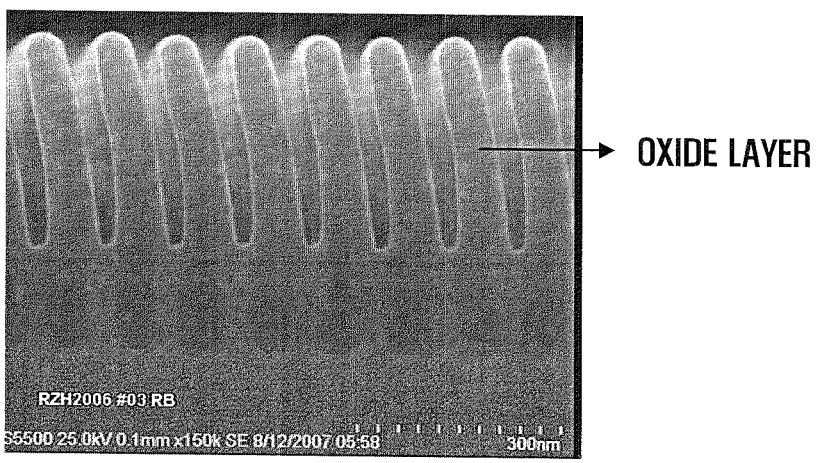

A mask pattern 38 is formed over the planarized resultant structure in order to form a trench for a word line. Specifically, the mask pattern 38 has a box- or bar-shaped opening that exposes a region between the respective pillars 310A in rows of the pillars 310 arranged in the first direction. Therefore, the mask pattern 38 exists over the hard mask pattern 32, which significantly differs from the line type mask pattern (see 18 of FIG. 1E).

To ensure an overlap margin, it is preferable that a width W2 of the opening in the first direction is greater than a distance W3 between the respective pillars 310A arranged in the row of the pillars 310 arranged in the first direction. Preferably, the width W2 is greater than the distance W3 by approximately 20 nm or less. In addition, to ensure the overlap margin, it is preferable that a width W4 of the opening in the second direction is less than a width W5 of the pillar 310 in the second direction The oxide layer 37 is etched to a predetermined depth using the mask pattern 38 as an etch barrier to thereby form a second trench T2 for a word line that exposes an upper portion of the surround type gate electrode 35. The upper portion of the hard mask pattern 32 is protected by the mask pattern 38, thus making it possible to minimize the loss of the hard mask pattern 32 during the etching of the oxide layer 37. Further, it is possible to minimize a leaning phenomenon during a subsequent thermal process because the oxide layer 37 remaining under the mask pattern 38 does not have a line shape. However, in accordance with the present invention, the width W2 of the opening of the mask pattern 38 in the first direction is greater than the distance W3 between the pillars 310 in the row of the pillars 310 in arranged in the first direction. To further prevent the loss of the hard mask pattern 32 at an edge thereof, therefore, it is preferable that the oxide layer 37 is etched at a temperature of approximately 40 or higher using a carbon fluoride (CF)-based gas such as $C_4F_6$ and $C_3F_3$ gas.

Although not shown, a wet etching is further performed to remove oxides that may remain on the sidewalls of the upper pillar 31A and the surround type gate electrode 35, which are exposed during the etching of the oxide layer 37.

Figure 3F:
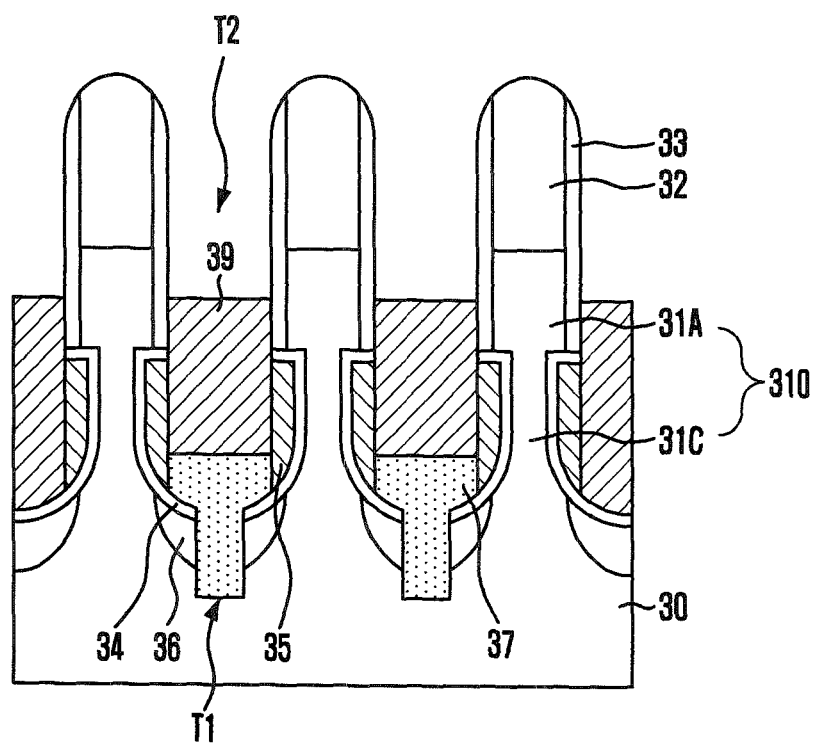

Referring to FIG. 3F, a conductive layer is formed to partially fill the second trench T2, thereby forming a word line 39 that interconnects the surround type gate electrodes 35 and extends in the first direction.

As described above, in accordance with the present invention, a box- or bar-shaped opening is used as a mask pattern to form a trench for a word line instead of a line type mask pattern. Accordingly, it is possible to minimize a loss of a hard mask on a pillar and a leaning phenomenon of an insulation layer remaining under the mask pattern after a trench for a word line is formed.

While the present invention has been described with respect to the specific embodiments, it will be apparent to those skilled in the art that various changes and modifications may be made without departing from the spirit and scope of the invention as defined in the following claims.

What is claimed is:

1. A mask layout for forming a word line of a vertical channel transistor including a plurality of pillars arranged in a first direction and a second direction crossing the first direction, the mask layout comprising openings only exposing gaps between each two adjacent pillars of the plurality of pillars and covering the other portions in the first direction.

2. The mask layout of claim 1, wherein a width of the openings in the first direction is greater by a predetermined value than a distance between each two adjacent pillar of the plurality of pillars in the first direction.

3. The mask layout of claim 2, wherein the predetermined value is greater than 0 nm but not greater than approximately 20 nm.

4. The mask layout of claim 1, wherein the openings have a length in the second direction smaller than a width of each of the pillars in the second direction.

5. The mask layout of claim 1, wherein the openings have a shape of a bar or a box.

* * * * *